US 6,712,627 B2

(12) United States Patent
Murnaghan et al.

(10) Patent No.: US 6,712,627 B2
(45) Date of Patent: Mar. 30, 2004

(54) MODEM EJECTION ASSEMBLY FOR A HANDHELD WIRELESS COMMUNICATION DEVICE

(75) Inventors: Matthew J. Murnaghan, North Vancouver (CA); Bruce D. Larsen, West Vancouver (CA)

(73) Assignee: Sierra Wireless, Inc., Richmond (CA)

( * ) Notice: Subject to any disclaimer, the term of this patent is extended or adjusted under 35 U.S.C. 154(b) by 178 days.

(21) Appl. No.: 09/816,758

(22) Filed: Mar. 23, 2001

(65) Prior Publication Data

US 2003/0008538 A1 Jan. 9, 2003

(51) Int. Cl.[7] ............................................. H01R 13/62
(52) U.S. Cl. ......................................................... 439/159
(58) Field of Search ................................. 439/159, 160; 361/754, 798; 235/486, 487, 479, 441

(56) References Cited

U.S. PATENT DOCUMENTS

| | | | |
|---|---|---|---|
| 5,497,339 A | 3/1996 | Bernard | 364/705.05 |
| 5,778,521 A | 7/1998 | Law et al. | 29/829 |
| 5,815,570 A * | 9/1998 | Hannon et al. | 379/428 |
| 6,035,216 A * | 3/2000 | Cheng et al. | 455/558 |
| 6,089,889 A * | 7/2000 | Chiou et al. | 439/159 |

FOREIGN PATENT DOCUMENTS

| | | | | |
|---|---|---|---|---|
| EP | 0 712 178 A2 | 5/1996 | | H01R/13/633 |
| EP | 0 834 827 A2 | 4/1998 | | G06K/13/08 |

* cited by examiner

*Primary Examiner*—Neil Abrams
(74) *Attorney, Agent, or Firm*—Thelen Reid & Priest, LLP; Robert E. Krebs

(57) ABSTRACT

An ejection assembly for ejecting a modem from a wireless communication device is provided. The wireless communication device provides communication capability for a personal data assistant. In one embodiment of the present invention, the ejection assembly includes both an ejector sleeve which holds a variety of modems and a lever arm. The ejector sleeve couples the modem with the wireless communication device to establish connectivity between the wireless communication device and the modem. The ejector sleeve also decouples the modem with the wireless communication device and ejects the modem from the wireless communication device. The modem decouples and ejects from the wireless communication device when a user pushes the ejector sleeve into the wireless communication device, thereby rotating the lever arm. The rotation of the lever arm decouples the modem and ejects the modem from the wireless communication device.

22 Claims, 7 Drawing Sheets

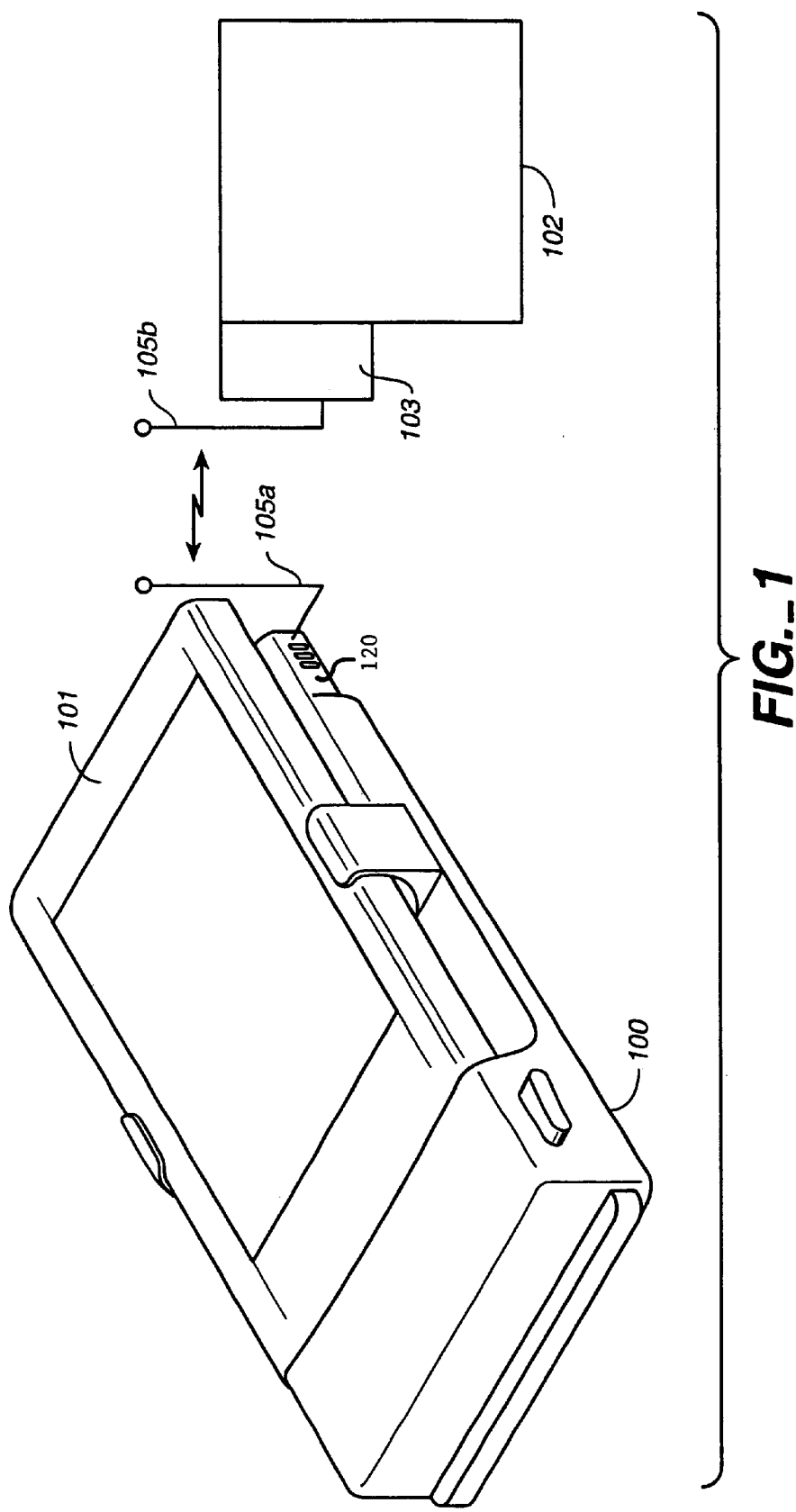
FIG._1

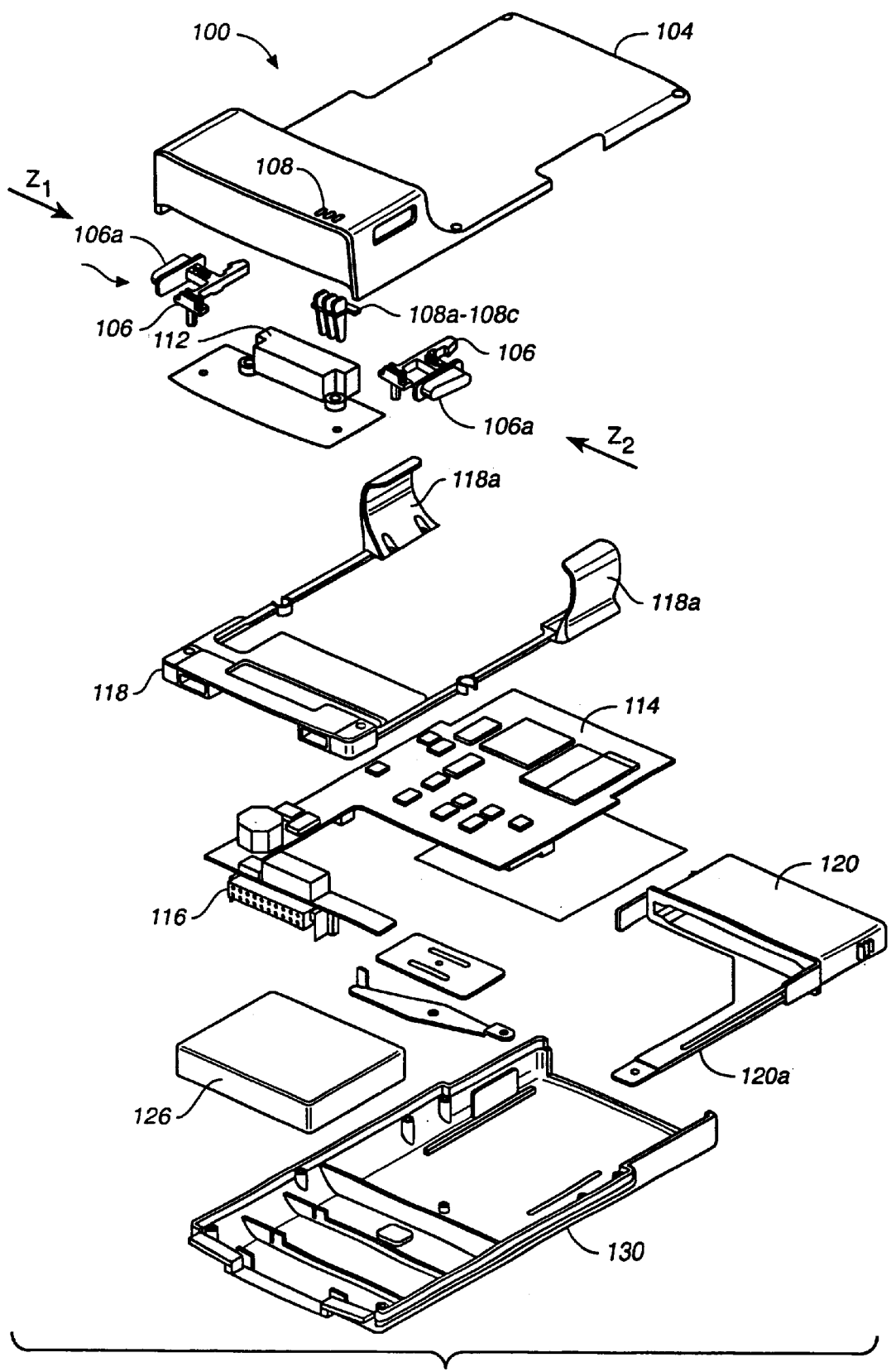
FIG._2A

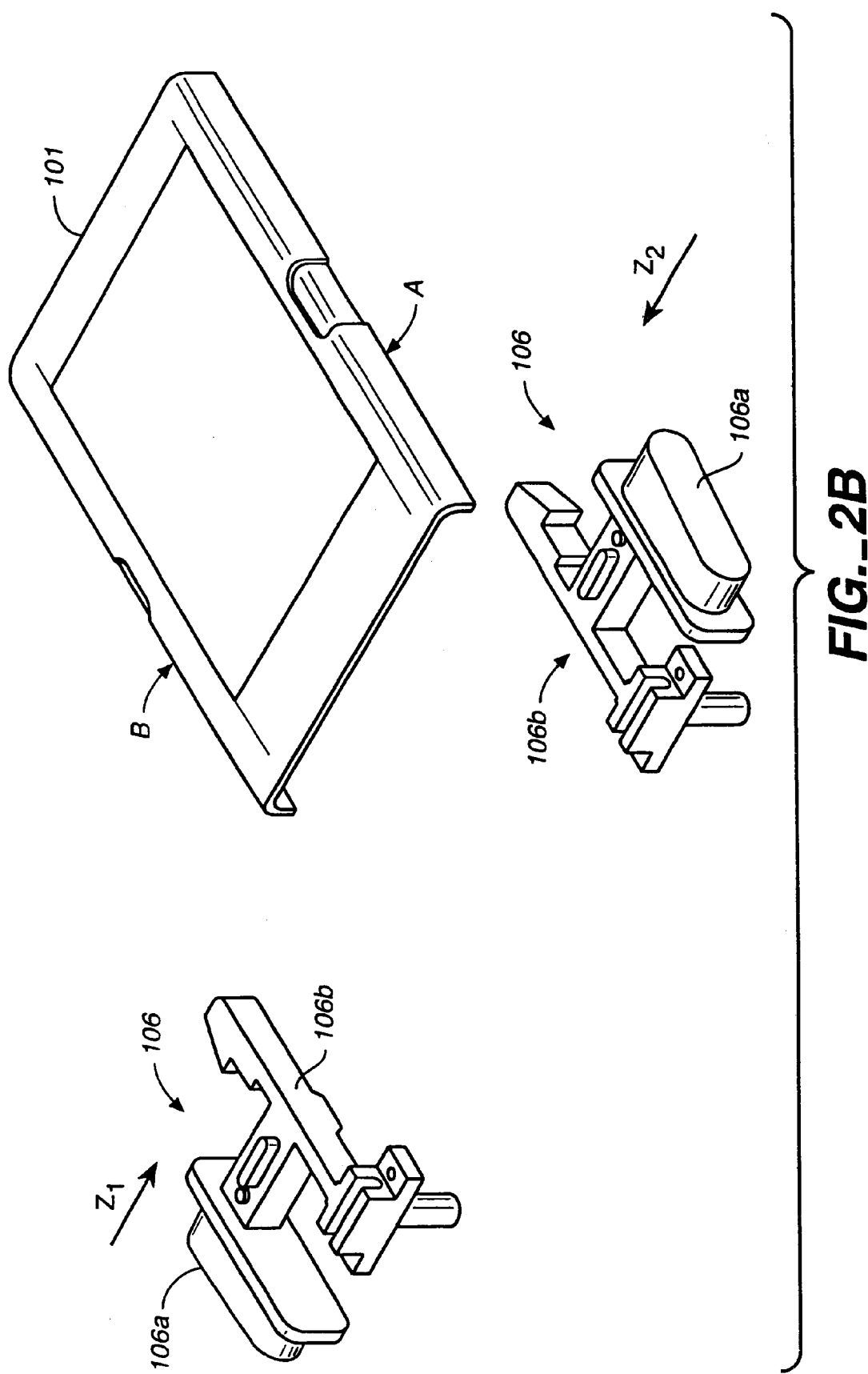

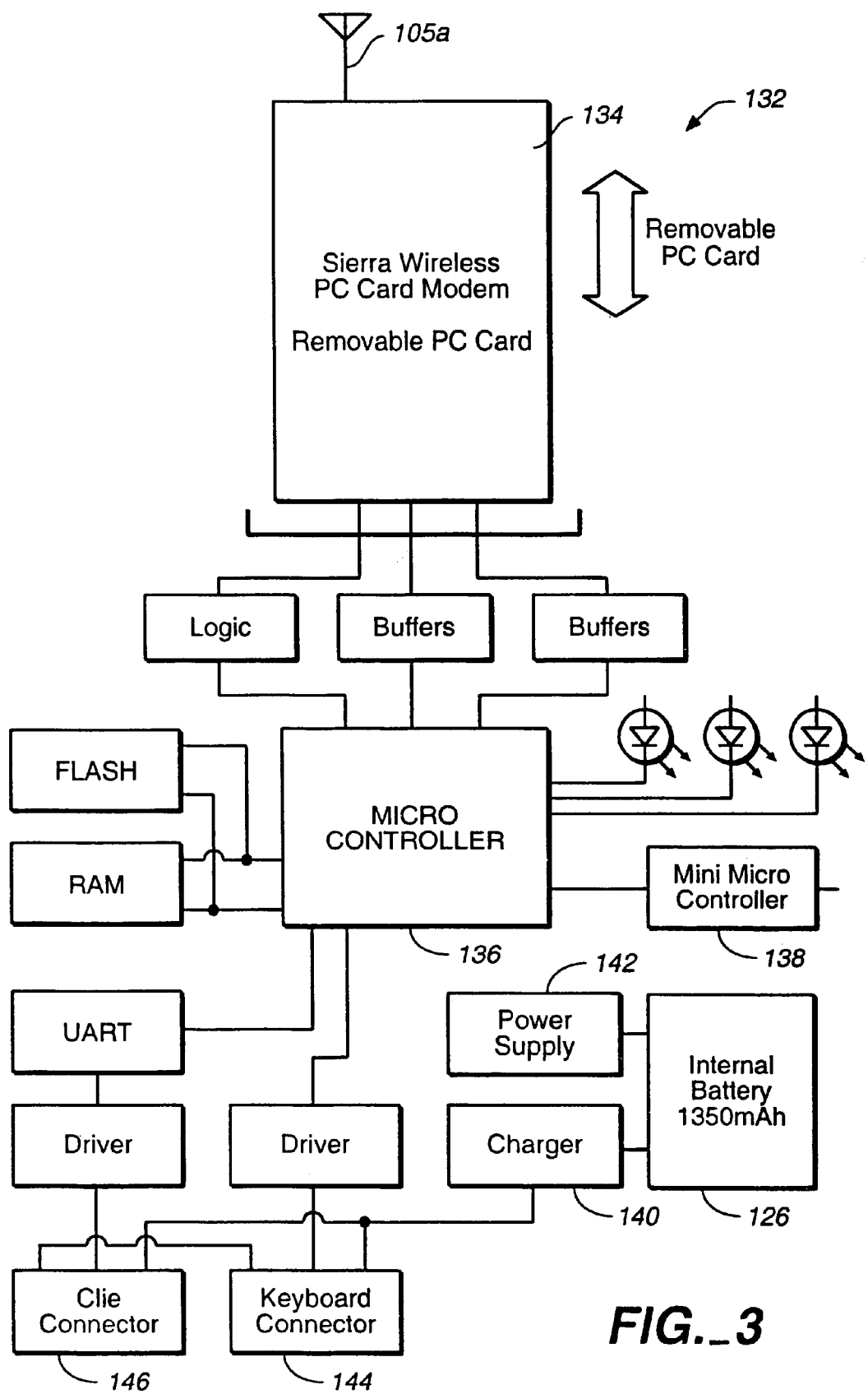
FIG._3

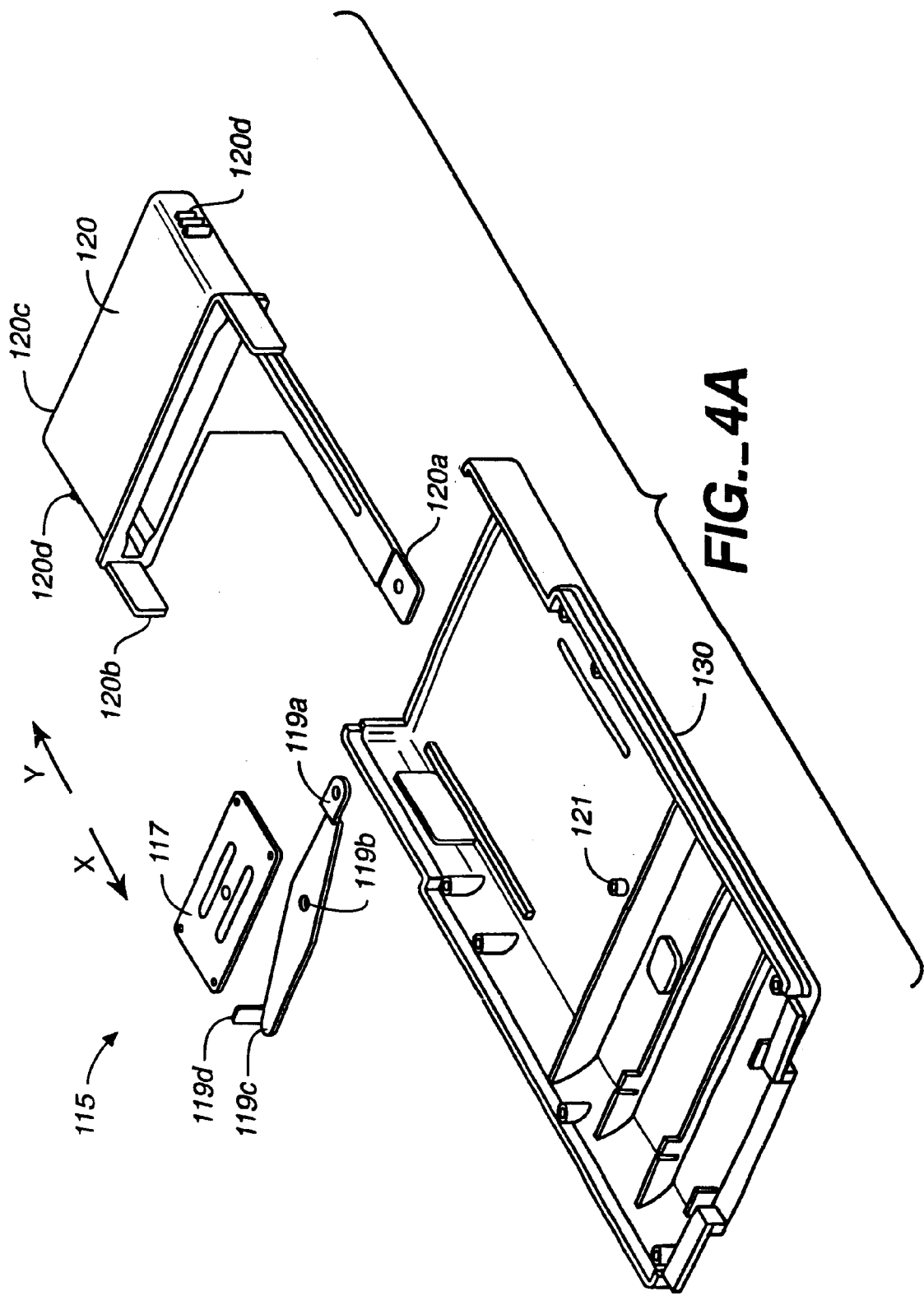
FIG._4A

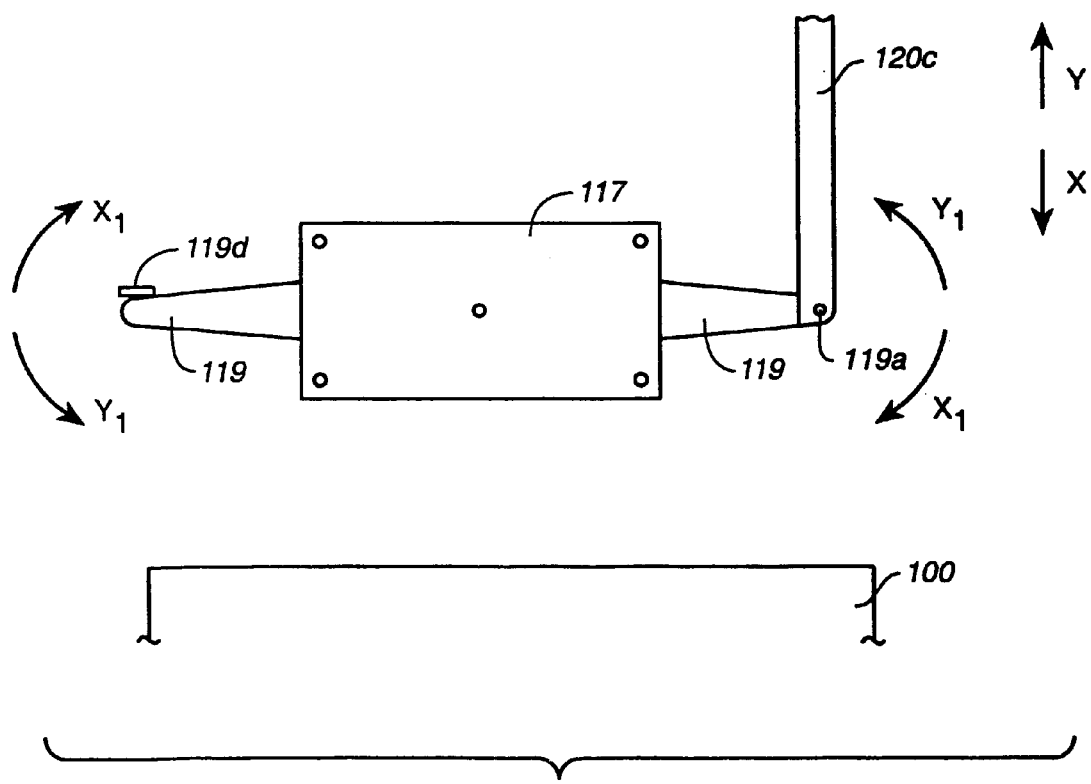
FIG._4B

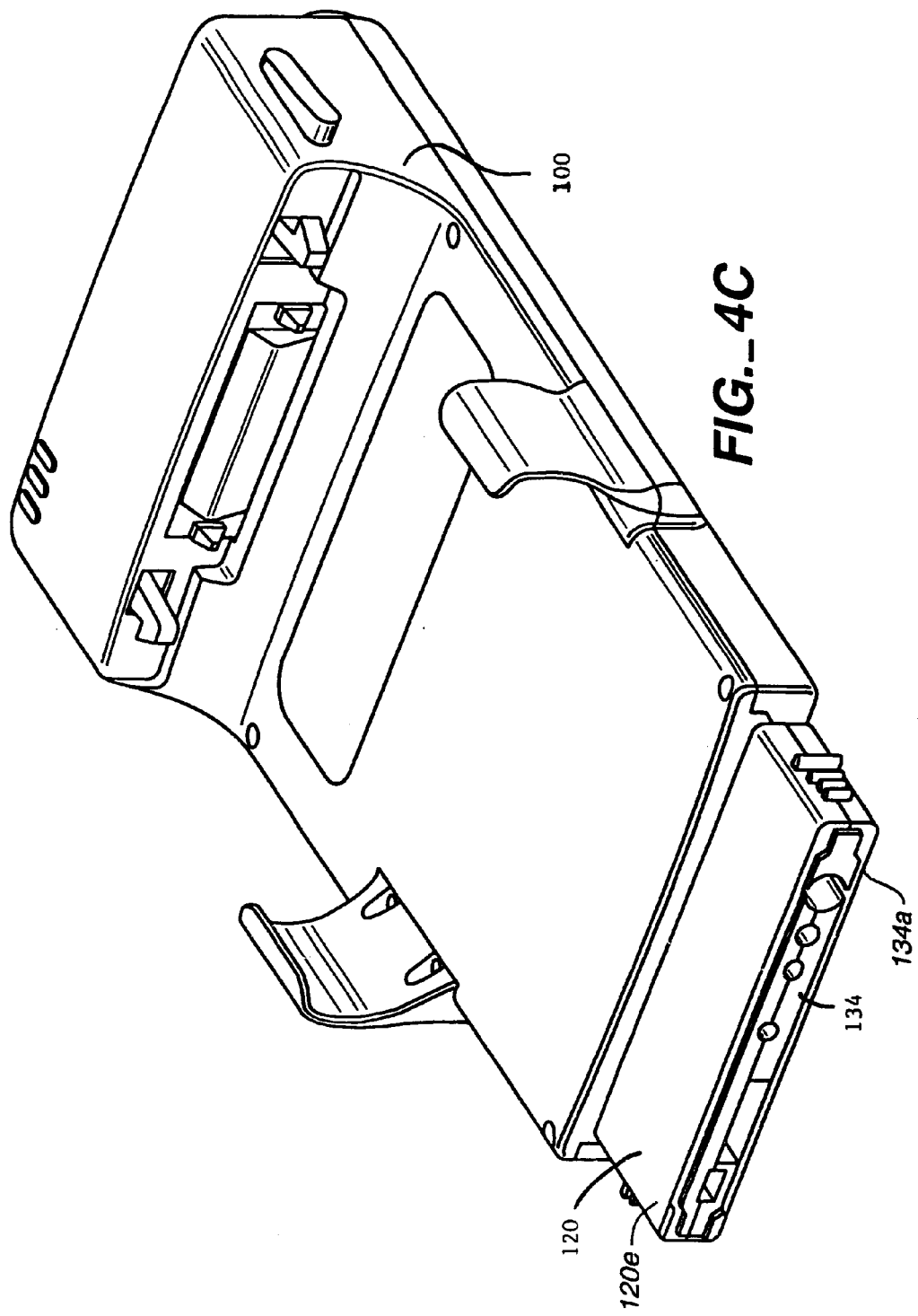
FIG._4C

MODEM EJECTION ASSEMBLY FOR A HANDHELD WIRELESS COMMUNICATION DEVICE

BACKGROUND OF THE INVENTION

1. Field of the Invention

The present invention relates generally to wireless communication devices and more particularly to modem ejection mechanisms for wireless communication devices.

2. Description of Related Art

Today, users reliance on wireless communication continues to steadily increase. This reliance includes the use of wireless communication with handheld devices. These handheld devices include Sony™ CLIE™ personal data assistants and Palm™ handheld devices. These handheld devices allow a user to organize data and provide reminders to the user of certain upcoming events such as meetings. In addition, these devices allow a user to wirelessly communicate.

The wireless communication capabilities allow a user to access electronic mail (email), the internet, and other web applications while they are using the handheld device. However, the user is not able to simultaneously run a communication application and a non-communication application with current single-threaded devices. For instance, when a user accesses the handheld device, the user typically runs a non-communication application, such as an address book function, games or a date book function. Thus, while a non-communication application such as the address book is in use, the user may not run a communication application, such as email. Instead, the user must end the non-communication application and then engage the communication application. As may be appreciated, this interferes with the ability of a user to multitask with the device, such as running a non-communication application and checking email at the same.

In addition, as the user runs a non-communication application, if the user receives data, such as email, the handheld device does not inform the user of the new mail. The handheld device does not perform periodic checks to ascertain whether or not the user has received new communications. Currently, most handheld devices are single-threaded, thus, in order to determine whether or not new email has been sent, the user must end the non-communication application as described and access the email application. As may be appreciated, this prevents efficient use of the handheld device since the user must end a non-communication application in use prior to accessing their email account to determine whether or not the user has received email. Furthermore, current handheld devices require custom wireless communication devices tailored for that specific handheld device. Therefore, greater costs are incurred in designing a specific wireless communication device for a particular handheld device. Also, the current wireless communication devices available for handheld devices have a big footprint resulting from a short and thick configuration. As a result, the handheld device, when coupled with the prior art wireless communication devices, tends to be cumbersome and difficult to use, thereby negating the handheld aspect of the handheld device due to the large size of the wireless communication device.

Moreover, in order to allow simultaneous charging of the wireless communication device and the handheld device, the wireless communication device includes separate power chargers for the wireless communication device and the handheld device. The necessary hardware for the separate chargers (i.e. additional cables, addition circuitry, etc.) increases the overall complexity, weight and cost of the wireless communication device. Likewise, the added hardware increases the possibility of failure, thereby decreasing reliability of the wireless communication device.

Furthermore, as stated earlier, prior art wireless communication devices were not adaptable for different handheld devices. To further illustrate, the configuration of prior art wireless communication devices allowed interfacing with a single type of handheld device. As such, a wireless communication device for a particular handheld device could not be used for other devices. Manufacturers designed different wireless communication devices for different handheld devices, thereby increasing manufacturing costs and ultimately costs to consumers. In addition to increased costs associated with prior art wireless communication devices, prior art wireless communication devices lacked the capability to interface directly with peripheral devices. Thus, prior art wireless communication devices for handheld devices precluded users from engaging the wireless communication device with peripheral devices such as portable keyboards or the like.

The ejection mechanisms of prior art wireless communication devices further compounded inconvenience to users of these modems. The prior art ejection mechanisms used many parts in order to effect ejection of the modem from the wireless communication device. As such, the weight and the increased size of the additional components added to the inconvenience of the wireless communication device. In addition, the added complexity of the ejection mechanisms decreased overall reliability of the wireless communication device due to the increased possibility of failure from the additional parts. Likewise, as may be appreciated, the additional parts increased the overall cost of the wireless communication device having the prior art ejection mechanism.

Therefore, a need exists to provide a device which allows a user to simultaneously run non-communication and communication applications in a single-threaded configuration with a handheld device. The new device should allow periodic checks of email as the user operates separate functions with the handheld device. In addition, this new device should be lightweight, compact and use readily available components capable of providing wireless communication to the handheld device. Likewise, this new device should allow interface capabilities with additional peripheral devices and simultaneous charging of the modem along with the handheld device using a single connector. Also, the configuration of the wireless communication device should allow retention of modem capabilities during charging of the wireless communication device. The new device should include an ejection mechanism using a minimal amount of components, thereby maintaining the lightweight and compact nature of the device.

BRIEF SUMMARY OF THE INVENTION

The present invention fills the aforementioned needs by providing a wireless communication device for handheld devices such as personal data assistants. The wireless communication device allows simultaneous charging of both the handheld device and the wireless communication device and interfacing of both the wireless communication device and the handheld device with peripheral devices.

In one embodiment of the present invention, a wireless communication device for providing wireless communication to a personal data assistant is disclosed. The wireless communication device includes a modem, an ejector sleeve and a lever arm operably connected with the wireless communication device. The modem provides wireless communication for the personal data assistant. The ejector sleeve allows coupling of the modem with the wireless communication device while the personal data assistant is coupled with the wireless communication device. The ejector sleeve rotatably couples with the lever arm at a first end of the lever arm such that the ejector sleeve rotates the lever arm in a first direction as the modem couples with the wireless communication device. The lever arm also includes a tab at an end opposite the first end. The tab operably connects with the modem such that the tab decouples the modem and ejects the modem from the wireless communication device by pushing the modem when the lever arm rotates in a direction opposite the first direction. The modem couples with the wireless communication device and ejects from the wireless communication device while the personal data assistant is coupled with the wireless communication device.

In another embodiment of the present invention, an ejection assembly for a wireless communication device is disclosed. The wireless communication device provides wireless communication to a personal data assistant using a modem coupled with the wireless communication device. The ejection assembly couples the modem with the wireless communication device and ejects the modem from the wireless communication device while the personal data assistant is coupled with the wireless communication device. The ejector assembly includes an ejector sleeve which holds the modem and a lever arm operably connected with the wireless communication device. The ejector sleeve ejects the modem from the wireless communication device while the personal data assistant couples with the wireless communication device. Likewise, the ejector sleeve couples the modem with the wireless communication device while the personal data assistant couples with the wireless communication device in order to establish connectivity between the wireless communication device and the modem. The established connectivity between the modem and the wireless communication device allows the wireless communication device to provide wireless communication to the personal data assistant. The ejection assembly also includes the lever arm rotatably coupled with the ejector sleeve at a first end of the lever arm. The lever arm activates the ejector sleeve to slide the ejector sleeve with respect to the wireless communication device. The sliding motion of the ejector sleeve couples the modem with the wireless communication device and ejects the modem from the wireless communication device. The modem ejects from the wireless communication device when a second end of the lever arm opposite the first end of the lever arm moves the modem with respect to the wireless communication device.

In a further embodiment of the present invention, an ejection assembly for coupling a modem with a wireless communication device and ejecting the modem from the wireless communication device is disclosed. The ejection assembly couples the modem with the wireless communication device such that the wireless communication device provides wireless communication capability to a personal data assistant coupled with the wireless communication device. The ejector assembly includes an ejector sleeve and a lever arm operably connected with the wireless communication device. The configuration of the ejector sleeve allows the ejector sleeve to couple and eject the modem from the wireless communication device while the personal data assistant remains coupled with the wireless communication device. When the ejector sleeve couples the modem with the wireless communication device, connectivity is established between the wireless communication device and the modem such that the wireless communication device provides wireless communication capability to the personal data assistant. The lever arm rotatably couples with the ejector sleeve at an end opposite a first end of the lever arm having a tab. The tab operably connects with the modem such that movement of the tab moves the ejector sleeve to couple the modem with the wireless communication device and ejects the modem from the wireless communication device.

Therefore, as may be appreciated, the present invention provides a wireless communication device having an ejection assembly capable of coupling a modem with the wireless communication device and ejecting the modem from the wireless communication device while a personal data assistant remains coupled with the wireless communication device. The present invention uses an ejector sleeve and lever arm to couple the modem with the wireless communication device and eject the modem from the wireless communication device. Therefore, the configuration of the ejection assembly maintains a lightweight and compact configuration of the wireless communication device.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements and wherein:

FIG. 1 shows a handheld device communicating with a server via a wireless communication device in accordance with one embodiment of the present invention.

FIG. 2A is an embodiment of the present invention showing an exploded perspective view of the wireless communication device shown with respect to FIG. 1, where internal components of the wireless communication device are more clearly shown.

FIG. 2B shows a perspective view of the catch buttons shown with respect to FIG. 2A, in accordance with one embodiment of the present invention.

FIG. 3 is an embodiment of the present invention illustrating a block diagram of the custom interface circuitry shown with reference to FIG. 2A.

FIG. 4A is an embodiment of the present invention illustrating a perspective view of an ejection assembly of the wireless communication device shown with respect to FIG. 2A.

FIG. 4B illustrates the motion of the lever arm shown with respect to FIG. 4A within the positioning plate, in accordance with an embodiment of the present invention.

FIG. 4C shows a perspective view of the wireless communication device shown with reference to FIG. 1, in accordance with one embodiment of the present invention.

DETAILED DESCRIPTION OF THE INVENTION

The present invention provides a device for providing wireless communication to a personal data assistant. As an overview, the present invention discloses a wireless communication device which holds a personal data assistant while providing wireless communication for the personal data assistant. In accordance with one embodiment of the present invention, the configuration of the wireless communication device includes an ejection assembly which allows ejection of a modem in a wireless communication device while a personal data assistant remains coupled with the wireless communication device. In addition, as will be discussed in greater detail with respect to the accompanying figures, the configuration of the ejection assembly allows replacement of the modem with a second modem.

Now making reference to the Figures, and more particularly FIG. 1, FIG. 1 shows a handheld device 101 communicating with a server 102 via a wireless communication device 100. In accordance with one embodiment of the present invention, the wireless communication device 100 may be a module capable of facilitating wireless communication for the handheld device 101 shown with reference to FIG. 1. The handheld device 101 may be any device capable of serving as a personal data assistant (PDA), such as a Sony™ CLIE™ personal data assistant, a Palm™ handheld device or the like. The server 102 may be any remote or local device suitable for transmitting and receiving data. In accordance with one embodiment of the present invention, the server 102 includes communications and message notifications. A message notification indicates that a user has communications, such as electronic mail or the like, on the server 102. The handheld device 101 wirelessly communicates with the server 102 using the wireless communication device 100. An antenna 105a of the wireless communication device 100 transmits data from the handheld device 101 to an antenna 105b of a cellular base station 103. The cellular base station 103 converts the wireless communication to land line communication. To further illustrate, with respect to wireless communication using a cellular digital packet data (CDPD) protocol, the cellular base station 103 converts the CDPD transmission protocol to land line communication, such that the cellular base station 103 may route the data to the server 102. Internal components of the wireless communication device 100, as more clearly shown with reference to FIG. 2, facilitate wireless communication of the handheld device 101.

FIG. 2 is an exploded perspective view of the wireless communication device 100 shown with respect to FIG. 1, where internal components of the wireless communication device 100 are more clearly shown. As may be seen with respect to the Figure, the wireless communication device 100 includes a top housing 104 having catches 106, catch buttons 106a and an LED port 108. The catches 106 hold the handheld device 101 as the handheld device 101 inserts into the wireless communication device 100.

Turning to FIG. 2B and the catches 106 shown therein, the catches 106 include the catch buttons 106a and surfaces 106b. As the handheld device 101 inserts into the wireless communication device 100, sides A and B of the handheld device 101 come into contact with the surfaces 106b. The catches 106 hold the handheld device 101 in place until the handheld device 101 ejects from the wireless communication device 100. In order to eject the handheld device 101, the catch buttons 106a move in the directions indicated by directional arrows $Z_1$ and $Z_2$, thereby ejecting the handheld device 101 from the wireless communication device 100.

Turning back to FIG. 2A, the LED port 108 of the top housing 104 allows viewing of indicators, such as LEDs 108a through 108c, by a user of the wireless communication device 100. The LEDs 108a through 108c indicate various functions performed by the wireless communication device 100. Among the functions indicated by the LEDs 108a through 108c include whether or not a data packet is either received by a modem 134 (shown with reference to FIG. 3) or transmitted by the modem 134. Another function of the LEDs 108a through 108c includes indicating successful registration of the modem 134 with a CDPD network. In addition, the LEDS 108a through 108c indicate a low battery condition of a battery 126. Also, as the battery 126 charges, the LEDs 108a through 108c indicate the charging condition of the battery 126 by flashing at a slow rate. Upon full charging of the battery 126, the LEDs 108a through 108c turn on continuously.

In addition to the LEDs 108a through 108c, the top housing 104 also includes a connector 112. The connector 112 facilitates connection between the wireless communication device 100 and the handheld device 101. The connector 112 may be a serial connector which facilitates coupling of the wireless communication device 100 with the handheld device 101. In a preferred embodiment of the present invention, the connector 112 is a serial connector which facilitates coupling of the wireless communication device 100 and a serial port connector of a Sony™ CLIE™ personal data assistant. In addition, in this embodiment, the serial connector allows hot-synching of the handheld device 101 and provides charging to the battery 126. Moreover, the serial connector provides voltage and power to the modem 134 and includes hand-shaking functionality.

As described earlier, the connector 112 allows coupling of the wireless communication device 100 with the handheld device 101. Therefore, in order to accommodate different handheld devices (i.e., different Sony™ CLIE™ personal data assistant models), the connector 112 may be replaced with another connector (not shown) in order to allow coupling of the wireless communication device 100 with a different handheld device 101. As such, the interchangability of the connector 112 with different connectors adaptable for different handheld devices increases the adaptability of wireless communication device 100 with different handheld devices.

The wireless communication device 100 also includes custom interface circuitry 114. The custom interface circuitry 114 provides an electrical interface between the modem 134 and the handheld device 101. The custom interface circuitry 114 controls both the LEDs 108a through 108c and a battery charger input 140 (shown with reference to FIG. 3) in addition to monitoring voltage of the battery 126 via a micro controller 136 (shown with reference to FIG. 3). In one embodiment of the present invention, the custom interface circuitry 114 operates at +5.0 vdc. Moreover, the custom interface circuitry 114 includes circuitry which provides power management such as remote powering up and remote powering down in order to maximize the life of the battery 126. In addition to maximizing the life of the battery 126, the custom interface circuitry 114 also includes a pass-through serial connector 116.

In accordance with one embodiment of the present invention, the pass-through serial connector 116 is an external serial connector such as a SMK connector having multi-functional capabilities available from SMK Corporation located in Santa Clara, Calif. These multi-functional capabilities include providing connectivity for both the wireless communication device 100 and the handheld device 101 with peripheral devices and various charging capabilities. The configuration of the pass-through serial connector 116 provides connectivity between the wireless communication device 100 and peripheral devices (not shown) which communicate with the handheld device 101 such as a portable keyboard, a MP3 player, a computer or the like. Likewise, the pass-through serial connector 116 also provides connectivity between the handheld device 101 and peripheral devices (not shown) such as a portable keyboard, a personal computer via a personal computer serial port or the like. It should be noted that the handheld device 101 and the peripheral device remain in communication with one another upon power down of the wireless communication device 100. Therefore, upon power down of the peripheral device by passing through the wireless communication device 100.

The configuration of the pass-through serial connector 116 also allows hot-syncing of the handheld device 101 when the handheld device 101 and the wireless communication device 100 are coupled with one another. Likewise, the pass-through serial connector 116 allows hot-syncing of the handheld device 101 as the wireless communication device 100 charges. The pass-through serial connector 116 also allows simultaneous charging of the wireless communication device 100 and the handheld device 101 during hot-syncing of the handheld device 101. It should be noted that the pass-through serial connector 116 does not affect the hot-syncing capability of the handheld device 101 when the handheld device 101 hot-syncs using the pass-through serial connector 116.

In addition to providing connectivity to both the wireless communication device 100 and the handheld device 101 with peripheral devices, the configuration of the pass-through serial connector 116 also provides various charging capabilities. The pass-through serial connector 116 allows simultaneous charging of both the wireless communication device 100 and the handheld device 101. Besides providing simultaneous charging, the pass-through serial connector 116 also allows charging of the wireless communication device 100 during use of the handheld device 101. Therefore, a user may simultaneously charge the wireless communication device 100 while performing other tasks the handheld device 101.

In addition to the pass-through serial connector 116, the wireless communication device 100 also includes a clip assembly 118. The clip assembly 118 couples with a top housing 104, as shown with reference to the Figure. The top housing 104 couples with the clip assembly 118 using any suitable technique, such as fasteners, rivets, or the like. The clip assembly 118 holds the handheld device 101 with the wireless communication device 100 using clips 118a. The configuration of the clips 118a allow holding of the handheld device 101 by the wireless communication device 100 as shown with reference to the Figure. Therefore, the top housing 104 and the clips 118a provide a mechanical interface between the wireless communication device 100 and the handheld device 101. The wireless communication device 100 also includes the battery 126 which provides power to the wireless communication device 100. In one embodiment of the present invention, the battery 126 is preferably a 3.6 V lithium-ion battery providing between about 1130 mA to about 1500 mA of power.

In addition to the clip assembly 118, the top housing 104 also couples with a bottom housing 130. In one embodiment of the present invention, the top housing 104 and the bottom housing 130 may be formed out of any material suitable for forming a lightweight housing, such as plastic or the like. It should also be noted that the top and bottom housings 108 and 124 are configured such that the top and bottom housings 108 and 124 form the wireless communication device 100 into a streamlined, compact design, as may be seen with reference to FIG. 1.

Now making reference to FIG. 3, FIG. 3 is an embodiment of the present invention illustrating a block diagram 132 of the custom interface circuitry 114 shown with reference to FIG. 2. The wireless communication device 100 includes the modem 134, a micro controller 136 and a mini micro controller 138. The modem 134 interfaces with the custom interface circuitry 114 with an interface (not shown) having an 8-bit data bus, a 12-bit address bus and 16 control lines. The interface is electrically buffered and protected against electro static discharge (ESD) using any suitable technique, such as a solid state buffer having built-in ESD protection or any other technique suitable for electrical buffering and protection against ESD.

The modem 134 provides communication capability to the wireless communication device 100. In one embodiment of the present invention, the modem 134 may be a standard PC card capable of supporting a range of communication protocols to the wireless communication device 100, including cellular digital packet data (CDPD), code-division multiple access (CDMA), Ricochet network modem or the like. In one embodiment of the present invention, the modem 134 is an AirCard 300™ available from Sierra Wireless of Richmond, British Columbia, Canada. In an embodiment using a CDPD PC card, the functionality of the CDPD communication protocol resides on the custom interface circuitry 114. Likewise, the protocol stack for the CDPD communication protocol resides on the custom interface circuitry 114. When the modem 134 successfully connects to a CDPD network in order to transmit data, the mini micro controller 138 activates one of the LEDs 108a through 108c in order to inform a user of a successful registration of the modem 134.

The mini micro controller 138, which resides on the custom interface circuitry 114, includes a wake-up function. In one embodiment of the present invention, the wireless communication device 100 periodically checks if the server 102 has received any message notifications for communications, such as electronic mail (email). The wireless communication device 100 periodically checks for communications using the wake-up function controlled with logic such as the mini micro controller 138. The mini micro controller 138 provides the necessary functionality to allow the modem 134 to periodically check at regular intervals for message notifications. The mini micro controller 138 may be any standard single chip micro-controller such as an TIMSP 430F1121, available from Texas Instruments Corporation, located in Dallas, Tex., or the like, capable of providing functionality which allows the modem 134 to periodically check for message notifications on the server 102. In alternative embodiments of the present invention, the logic may also be an application specific integrated circuit (ASIC), programmable logic, a processor, a field programmable gate array (FPGA) or the like. It should be noted that the wake-up function checks for communications and message notifications regardless of whether or not the modem 134 or the wireless communication device 100 are connected to the handheld device 101. Therefore, the mini micro controller 138 automatically checks for communications stored on the server 102. When the mini micro controller 138 determines there are new communications, the mini micro controller 138 activates the LEDs 108a through 108c. The mini micro controller 138 activates the LEDs 108a through 108c by simultaneously flashing the LEDs 108a through 108c.

The mini micro controller 138 also provides advanced power management in one embodiment of the present invention. If the mini micro controller 138 determines that the modem 134 is not in use, the mini micro controller 138 may go into a power down mode, where a minimal amount of battery power is used while the modem 134 is not communicating. In one embodiment of the present invention, the mini micro controller 138 also monitors the voltage of the battery 126. Thus, as the voltage of the battery 126 drops and the amount of available power decreases, the mini micro controller 138 activates one of the LEDs 108a through 108c in order to indicate to a user of the handheld device 101 the low voltage of the battery 126. In this embodiment, the mini micro controller 138 flashes one of the LEDs 108a through 108c at a slow rate to indicate to a user the voltage status of the battery 126.

During charging of the battery 126, the mini micro controller 138 slowly flashes one of the LEDs 108a through 108c to indicate the charging status of the battery 126 to a user. Upon charging of the battery 126, one of the LEDs 108a through 108c turns on continuously. It should also be noted that when the wireless communication device 100 is coupled with the handheld device 100, the mini micro controller 138 indicates to a user via the handheld device 101, such as on a screen of the handheld device 101, the voltage level of the battery 126.

The micro controller 136 also resides on the custom interface circuitry 114. The micro controller 136 provides an interface between the handheld device 101 and the wireless communication device 100. The micro controller 136 also provides communication between the handheld device 101 and the wireless communication device 100. In one embodiment of the present invention, the micro controller 136 may be any embedded micro controller such as a Motorola 68 LC302 available from Motorola Incorporated located in Austin, Tex., or the like. The micro controller 136 buffers data received from a peripheral device coupled with the wireless communication device 100 via the pass-through serial connector 116. As such, the configuration of the micro controller 136 allows sharing of data between the wireless communication device 100 and the handheld device 101 received via the pass-through serial connector 116.

The micro controller 136 also contains software to run the modem 134. To further illustrate, if the wireless communication device 100 suddenly loses connectivity with the modem 134 during data transmission (i.e., user inadvertently ejects the modem 134 from the wireless communication device 100), the software of the micro controller 136 prevents lock-up of the handheld device 101 and informs the user of the loss of connectivity. Furthermore, as previously described, the modem 134 may be a PC card capable of supporting a range communication protocols to the wireless communication device 100. The micro controller 136 includes software to run various PC cards supporting a range of communication protocols.

The custom interface circuitry 114 also includes circuitry for the battery charger input 140 incorporated into the pass-through serial connector 116. The battery charger input 140 charges the battery 126 with a DC power adapter. The DC power adapter may be any direct current power adapter such as a 5.7 volt dc 2 amp switching supply or linear supply or the like suitable for charging the battery 126 while simultaneously allowing operation of the modem 134 using the battery charger input 140. It should be noted that the wireless communication 100 may be charged while the wireless communication device 100 is either in communication with the handheld device 101 or not in communication with the handheld device 101. The battery charger input 140 includes inputs connected in parallel such that the inputs feed both wireless communication device 100 and the handheld device 101 during charging. Therefore, the wireless communication device 100 and the handheld device 101 may simultaneously charge by leaving each device in communication with one another while applying the DC power adapter to the wireless communication device 100.

The configuration of the wireless communication device 100 also allows ejection of the modem 134 during normal operation of the wireless communication device 100, as shown with reference to FIG. 4A. FIG. 4A is an embodiment of the present invention illustrating a perspective view of an ejection assembly 115 of the wireless communication device 100 shown with respect to FIG. 2. The ejection assembly 115 includes a positioning plate 117, a lever arm 119 and an ejector sleeve 120. The configuration of the positioning plate 117 secures the lever arm 119 with the wireless communication device 100. As may be seen with reference to the Figure, the positioning plate 117 includes recesses 117a having a configuration which allow motion of the lever arm 119 within the positioning plate 117 as shown with reference to FIG. 4B.

FIG. 4B illustrates the motion of the lever arm 119 shown with respect to FIG. 4A within the positioning plate 117, in accordance with an embodiment of the present invention. As the modem 134 (not shown) inserts into the ejector sleeve 120, the modem 134 operably connects with a tab 119d such that the modem 134 moves the tab 119d of the lever arm 119 in a direction $Y_1$ as the modem 134 connects with the wireless communication device 100. When the tab 119d moves in the direction $Y_1$, a notch 119a of the lever arm 119 also rotates in the direction $Y_1$. The notch 119a rotatably couples with an ejector sleeve arm 120c of the ejector sleeve 120. Therefore, as the notch 119a moves in the direction $Y_1$, the ejector sleeve arm 120c and the ejector sleeve 120 slide in a direction Y. The ejector sleeve 120 moves in the direction Y until an edge 120e of the ejector sleeve 120 becomes flush with an edge 134a of the modem 134, as shown with reference to FIG. 4C. Once the ejector sleeve 120 becomes flush with the modem 134, the modem 134 couples with the wireless communication device 100 in order to establish connectivity between the modem 134 and the wireless communication device 100.

In order to decouple and eject the modem 134 from the wireless communication device 100, a user moves the ejector sleeve 120 in a direction X using grips 120d (as shown with reference to FIG. 4A). As the ejector sleeve 120 moves in the direction X, the notch 119a rotates in a direction $X_1$. When the notch 119a rotates in the direction $X_1$, the tab 119d also rotates in the direction $X_1$, thereby moving the modem 134 (not shown) in the direction Y. As the modem 134 moves in the direction Y, the modem 134 decouples from the wireless communication device 100 and ejects from the ejector sleeve 120. Upon ejection of the modem 134 from the wireless communication device 100, a user may insert a second modem into the wireless communication device 100.

Making reference once again to FIG. 4A, the positioning plate 117 attaches to the wireless communication device 100 at attachment points 130a using any suitable technique, such as threaded fasteners, rivets or the like. The positioning plate 117 holds the lever arm 119 with the wireless communication device 100. As described with reference to FIG. 4B, the lever arm 119 pivots within the wireless communication device 100 to couple and decouple the modem 134 from the wireless communication device 100. The lever arm 119 operably connects with a fulcrum 121 such that the lever arm 119 pivots on the fulcrum 121. In one embodiment of the present invention, the fulcrum 121 rigidly attaches to the bottom housing 130 of the wireless communication device 100. The orientation of the fulcrum 121 within the bottom housing 130 bisects the lever 119. As such, the fulcrum 121 allows reciprocal motion of the lever arm 119 within the bottom housing 130.

As described with reference to FIG. 4B, the lever arm 119 rotatably couples with the ejector sleeve arm 120c via a notch 119a on the lever arm 119. The notch 119a rotatably couples with the ejector sleeve arm 120c via a notch 120b on the ejector sleeve arm 120c. In one embodiment of the present invention, the lever arm 119 rotatably couples with the ejector sleeve arm 120c using any suitable technique, such as a pin assembly or the like.

The ejection assembly 115 also includes the ejector sleeve 120. The ejector sleeve 120 couples and decouples the modem 134 with the wireless communication device 100 as described with reference to FIG. 4B. It should be noted that the configuration of the ejector sleeve 120 allows coupling of various modems to the wireless communication device 100. To further illustrate, the ejector sleeve 120 may also hold a AirCard 400™ available from Sierra Wireless of Richmond, British Columbia, Canada. Therefore, as discussed earlier, a user may replace the modem 134 with a second modem upon ejection of the modem 134 from the wireless communication device 100.

As previously described, the ejector assembly 115 includes the ejector sleeve 120, the lever arm 119 and the positioning plate 117. Thus, the ejector assembly 115 limits the amount of parts required to allow ejection capability to the wireless communication device 100, as opposed to prior art ejection mechanisms, as discussed with reference to the background. Therefore, the three parts (positioning plate 117, lever arm 119 and ejector sleeve 120) minimize the overall complexity of the ejection assembly 115, thereby increasing overall reliability of the wireless communication device 100 and decreasing both the weight and the costs associated with the wireless communication device 100. Moreover, the configuration of the ejector sleeve 120, the lever 119 and the positioning plate 117 allow the retention of a compact and trim nature of the wireless communication 100, as shown with reference to FIG. 1.

The present invention now improves the convenience of handheld devices to users. The present wireless communication device provides multi-tasking capabilities to a handheld device. As such, a user of a handheld device having the present invention may check for received communications during operation of another application. Furthermore, the compact and trim design of the wireless communication device of the present invention preserves the handheld nature of handheld devices, thereby making the overall package of the handheld device and the wireless communication device less cumbersome. Moreover, the present invention automatically checks for communications on a remote server while the modem is not connected with a handheld device using a mini micro controller. Thus, the present invention automatically notifies a user of received communications while the user works with another application.

As may be appreciated, the present invention provides multitasking like capabilities to a single threaded device such as a personal data assistant. The personal data assistant accesses peripheral devices such as a remote keyboard or a personal computer while sending messages with the wireless communication device. Therefore, the multitasking capabilities of the present invention adds greater convenience and reduces the amount of time required by a user to perform various functions with a personal data assistant having the wireless communication device of the present invention.

Moreover, the present invention provides the ability of a wireless communication device to remain attached to a handheld device during charging. As previously stated, prior art modems lacked the capability to remain attached during charging. The present invention obviates this problem, thereby increasing convenience to users of the wireless communication device.

In addition, the present invention allows simultaneous charging of both the wireless communication device and the handheld device using a single connector, thereby avoiding the prior art problem of having separate connectors in a wireless communication device in order to allow for simultaneous charging of the wireless communication device and the handheld device. Thus, the present invention reduces complexity and increases reliability due to the fewer amount of components used in the present invention. The reduced complexity also reduces manufacturing costs and ultimate costs to consumers. As previously described, the invention may be easily reconfigured for different personal data assistants. Therefore, the costs typically associated with redesigning wireless communication devices for different personal data assistants and plant retooling are avoided, thereby minimizing overall costs to users of the wireless communication device.

The ejection mechanism of the present invention also allows interchangeability of the modem within the wireless communication device. Therefore, a user may update the modem of the wireless communication device as more advanced modems become available on the marketplace, thereby increasing the wireless communication capabilities of the wireless communication device and convenience to users.

The above are exemplary modes of carrying out the invention and are not intended to be limiting. It will be apparent to those of ordinary skill in the art that modifications thereto can be made without departure from the spirit and scope of the invention as set forth in the following claims.

What is claimed is:

1. A wireless communication device for providing wireless communication to a personal data assistant coupled with the wireless communication device, the wireless communication device comprising:

a modem coupled with the wireless communication device for providing wireless communication capability to both the wireless communication device and the personal data assistant;

an ejector sleeve for holding the modem within the wireless communication device, the ejector sleeve coupling the modem with the wireless communication device while the personal assistant is coupled with the wireless communication device;

a lever arm operably connected with the wireless communication device, the lever arm being rotatably coupled with the ejector sleeve at a first end of the lever arm such that the ejector sleeve operates to rotate the lever arm in a first direction while coupling of the modem with the wireless communication device; and a tab at an end of the lever arm opposite the first end of the lever arm, the tab being operably connected with the modem such that the tab moves the modem in order to decouple the modem from the wireless communication and eject the modem from the wireless communication device while the personal data assistant is coupled with the wireless communication device.

2. A wireless communication device as recited in claim 1, wherein the ejector sleeve is configured to hold different modems.

3. A wireless communication device as recited in claim 1, wherein the modem moves the tab of the lever arm as the modem inserts within the ejector sleeve.

4. A wireless communication device as recited in claim 3, the ejector sleeve further comprising:

grips rigidly attached to the ejector sleeve.

5. A wireless communication device as recited in claim 4, wherein the modem ejects from the wireless communication device by moving the grips of the ejector sleeve in a first direction.

6. A wireless communication device as recited in claim 4, wherein the modem decouples from the wireless communication device during ejection from the wireless communication device.

7. A wireless communication device as recited in claim 5, wherein the modem couples with the wireless communication device by moving the tab of the lever arm using the modem in a second direction opposite the first direction.

8. A wireless communication device as recited in claim 1, wherein connectivity is established between the wireless communication device and the modem when the modem couples with the wireless communication device such that the modem provides wireless communication capability to the wireless communication device.

9. A wireless communication device as recited in claim 5, wherein a user may replace the modem with a second modem when the modem ejects from the wireless communication device.

10. A wireless communication device as recited in claim 1, wherein the wireless communication device includes a fulcrum which allows reciprocal motion of the lever arm within the wireless communication device.

11. A wireless communication device as recited in claim 1, wherein the lever arm operably connects with the wireless communication device with the fulcrum.

12. An ejection assembly of a wireless communication device, the wireless communication device having a modem such that the wireless communication device provides wireless communication to a personal data assistant coupled with the wireless communication device using the modem, the ejection assembly ejecting the modem from the wireless communication device, the ejection assembly comprising:

an ejector sleeve configured to hold the modem of the wireless communication device, the ejector sleeve ejecting the modem from the wireless communication device while the personal data assistant is coupled with the wireless communication device and the ejector sleeve coupling the modem with the wireless communication while the personal data assistant is coupled with the wireless communication device such that connectivity is established between the modem and the wireless communication device in order to provide communication capability to the wireless communication device and the personal data assistant; and a lever arm operably connected with the wireless communication device, the lever arm being rotatably coupled with the ejector sleeve at a first end of the lever arm such that the lever arm activates the ejector sleeve in order to slide the ejector sleeve with respect to the wireless communication device, thereby coupling the modem with the wireless communication device, the lever arm ejecting the modem from the wireless communication device when a second end of the lever arm opposite the first end of the lever arm moves the modem with respect to the wireless communication device.

13. An ejection assembly as recited in claim 12, wherein the lever arm rotatably couples with the ejector sleeve with a pin assembly.

14. An ejection assembly as recited in claim 12, wherein the lever arm slides the ejector sleeve in a first direction to couple the modem with the wireless communication device in order to establish the connectivity between the modem and the wireless communication device.

15. An ejection assembly as recited in claim 14, wherein the lever arm slides the ejector sleeve in a second direction opposite the first direction to decouple the modem with the wireless communication device and eject the modem from the wireless communication device.

16. An ejection assembly as recited in claim 12, the wireless communication device further comprising:

a fulcrum which allows reciprocal motion of the lever arm within the wireless communication device.

17. An ejection assembly as recited in claim 16, wherein the lever arm operably connects with the wireless communication device with the fulcrum.

18. An ejection assembly as recited in claim 12, wherein a user may replace the modem with a second modem when the modem ejects from the wireless communication device.

19. An ejection assembly for a wireless communication device coupled with a personal data assistant, where the ejection assembly couples a modem with the wireless communication device such that the wireless communication device provides wireless communication to the personal data assistant using the modem, the assembly comprising:

an ejector sleeve configured to hold the modem such that the ejector sleeve ejects the modem from the wireless communication device and couples the modem with the wireless communication device in order to establish connectivity between the modem and the wireless communication device while the personal data assistant is coupled with the wireless communication device; and a lever arm operably connected with the wireless communication device, the lever arm having a tab at a first end of the lever arm, the lever arm being rotatably coupled to the ejector sleeve at an end opposite the first end, where movement of the tab moves the ejector sleeve to both couple the modem with the wireless communication device and eject the modem from the wireless communication device.

20. An ejection assembly as recited in claim 19, wherein the ejector sleeve slides in a first direction to couple the modem with the wireless communication device thereby establishing the connectivity between the wireless communication device and the modem.

21. An ejection assembly as recited in claim 20, wherein the lever arm moves the ejector sleeve in a second direction opposite the first direction to decouple the modem with the wireless communication device and eject the modem from the wireless communication device.

22. An ejection assembly as recited in claim 19, wherein the wireless communication device includes a fulcrum which allows reciprocal motion of the lever arm within the wireless communication device.

* * * * *

UNITED STATES PATENT AND TRADEMARK OFFICE
CERTIFICATE OF CORRECTION

PATENT NO.   : 6,712,627 B2
DATED        : March 30, 2004
INVENTOR(S)  : Matthew J. Murnaghan and Bruce D. Larsen It is certified that error appears in the above-identified patent and that said Letters Patent is hereby corrected as shown below:

<u>Column 7,</u>
Line 4, after "the" insert -- wireless communication device 100, the handheld device 101 still retains access to the --.

<u>Column 13,</u>
Line 14, replace "using" with -- while moving --.
Line 31, replace "1," with -- 10, --.
Line 32, replace "with" with -- through --.

<u>Column 14,</u>
Line 20, replace "with" with -- through --.

Signed and Sealed this

Twentieth Day of July, 2004

JON W. DUDAS
*Acting Director of the United States Patent and Trademark Office*